(12) United States Patent
Lee et al.

(10) Patent No.: US 8,344,612 B2
(45) Date of Patent: Jan. 1, 2013

(54) ORGANIC ELECTROLUMINESCENT DEVICE AND METHOD FOR FABRICATING THE SAME

(75) Inventors: Jae Yoon Lee, Seoul (KR); Kang Ju Lee, Gyeonggi-do (KR); Se Young Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 451 days.

(21) Appl. No.: 12/170,087

(22) Filed: Jul. 9, 2008

(65) Prior Publication Data

US 2009/0015149 A1  Jan. 15, 2009

(30) Foreign Application Priority Data

Jul. 9, 2007 (KR) .................. 10-2007-0068492

(51) Int. Cl.
*H01L 27/32* (2006.01)
*H01L 27/28* (2006.01)

(52) U.S. Cl. .................. 313/504; 313/498; 313/506

(58) Field of Classification Search ........... 313/498–512
See application file for complete search history.

(56) References Cited

U.S. PATENT DOCUMENTS

| | | | |
|---|---|---|---|
| 2002/0021088 A1* | 2/2002 | Howard et al. | 313/504 |
| 2005/0012454 A1* | 1/2005 | Yamazaki et al. | 313/506 |
| 2005/0242350 A1* | 11/2005 | Bae et al. | 257/59 |
| 2005/0275339 A1* | 12/2005 | Seo et al. | 313/503 |
| 2006/0119259 A1* | 6/2006 | Bae et al. | 313/506 |
| 2006/0170340 A1* | 8/2006 | Tzen et al. | 313/506 |

* cited by examiner

*Primary Examiner* — Joseph L Williams
*Assistant Examiner* — Nathaniel Lee
(74) *Attorney, Agent, or Firm* — Morgan, Lewis & Bockius LLP

(57) ABSTRACT

An organic electroluminescent device and a method of fabricating the same are provided. The organic electroluminescent device includes a first substrate, a second substrate, a thin film transistor formed on the first substrate, a light emitting diode comprising first and second electrodes and an organic luminescent layer that are formed on the thin film transistor, and first and second passivation layers formed on the first substrate on which the light emitting diode is formed.

10 Claims, 2 Drawing Sheets

ORGANIC ELECTROLUMINESCENT DEVICE AND METHOD FOR FABRICATING THE SAME

CROSS-REFERENCE TO RELATED APPLICATIONS

The present application claims priority under 35 U.S.C. 119 and 35 U.S.C. 365 to Korean Patent Application No. 10-2007-0068492, filed on Jul. 9, 2007, which is hereby incorporated by reference in its entirety.

BACKGROUND

The present disclosure relates to an organic electroluminescent device.

Recently, researches for developing flat display devices that is improved in a display quality and increased in a screen size have been making much progress. An electroluminescent device among the flat display devices is a self-emissive display device that can emit light itself. The electroluminescent device is designed to display a video image by exciting phosphors using carriers such as electrons and holes. The electroluminescent devices are classified into inorganic electroluminescent devices and organic electroluminescent devices. The organic electroluminescent devices is driven by a lower voltage of 5-20V compared to the inorganic electroluminescent devices driven by a voltage of 100-200V. That is, the organic electroluminescent device can be driven by a low voltage.

In addition, the organic electroluminescent device has a variety of excellent properties such as a relative wide viewing angle, a relatively high response speed, and a relative high contrast. Therefore, the electroluminescent device may be used as a pixel of a video display or a surface light source. Furthermore, since the electroluminescent device is relatively thin and has an excellent color quality, it is drawing attention as the upcoming flat display.

Meanwhile, passive matrix type organic electroluminescent devices that are not provided with separate thin film transistors (TFTs) have been widely used. Since the passive matrix type organic electroluminescent device has many limitations in power consumption, service life, and the like, an active matrix type, active matrix type organic electroluminescent devices have been developed as next generation displays requiring high resolution and large-sized screen.

However, since the active matrix type electroluminescent device is fabricated by attaching two substrates on which TFTs and organic electroluminescent layer are formed after forming a single seal line formed of ultraviolet sealant, moisture or gas may be easily infiltrated into the device.

In order to prevent the infiltration of the moisture and gas, a substrate with additional materials such as moisture absorption agent is formed inside the device. This causes increase a thickness of the device. Furthermore, there is a limitation in preventing the infiltration of the moisture using the moisture absorption agent.

SUMMARY

Accordingly, the present invention is directed to an organic electroluminescent device that substantially obviates one or more of the problems due to limitations and disadvantages of the related art.

Embodiments provide an organic electroluminescent device that is designed to prevent infiltration of moisture and outgas into an organic electroluminescent layer by forming a plurality of passivation layers on a substrate on which the organic electroluminescent layer and a method of fabricating the electroluminescent device.

Additional advantages, object, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In one embodiment, an organic electroluminescent device includes a first substrate, a second substrate, a thin film transistor on the first substrate, a light emitting diode comprising first and second electrodes and an organic luminescent layer on the first substrate, and first and second passivation layers on the first substrate on which the light emitting diode is formed.

In another embodiment, a method of fabricating an organic electroluminescent device includes providing a substrate; forming a thin film transistor on the substrate; forming a planarization layer on the substrate on which the thin film transistor is formed; forming a contact hole through the planarization layer; forming a first electrode on the planarization layer; forming a buffer layer on the first electrode for separating the sub-pixel region; forming a light emitting diode by forming an organic electroluminescent layer and a second electrode on the first electrode on which the buffer layer is formed; and sequentially forming first and second passivation layer on the substrate on which the light emitting diode is formed.

It is to be understood that both the foregoing general description and the following detailed description of the present invention are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

DETAILED DESCRIPTION OF THE EMBODIMENTS

Reference will now be made in detail to the embodiments of the present disclosure, examples of which are illustrated in the accompanying drawings.

In the present disclosure, infiltration of moisture or outgas into an organic electroluminescent layer is prevented by forming a plurality of passivation layers on a substrate on which the electroluminescent layer is formed.

In the following description, it will be understood that when a layer (or film) is referred to as being 'on' another layer or substrate, it can be directly on the another layer or substrate, or intervening layers may also be present. Further, it will be understood that when a layer is referred to as being 'under' another layer, it can be directly under the another layer, and one or more intervening layers may also be present. In addition, it will also be understood that when a layer is referred to as being 'between' two layers, it can be the only layer between the two layers, or one or more intervening layers may also be present.

The following will describe embodiments in detail with reference to the accompanying drawings.

Figure 1:
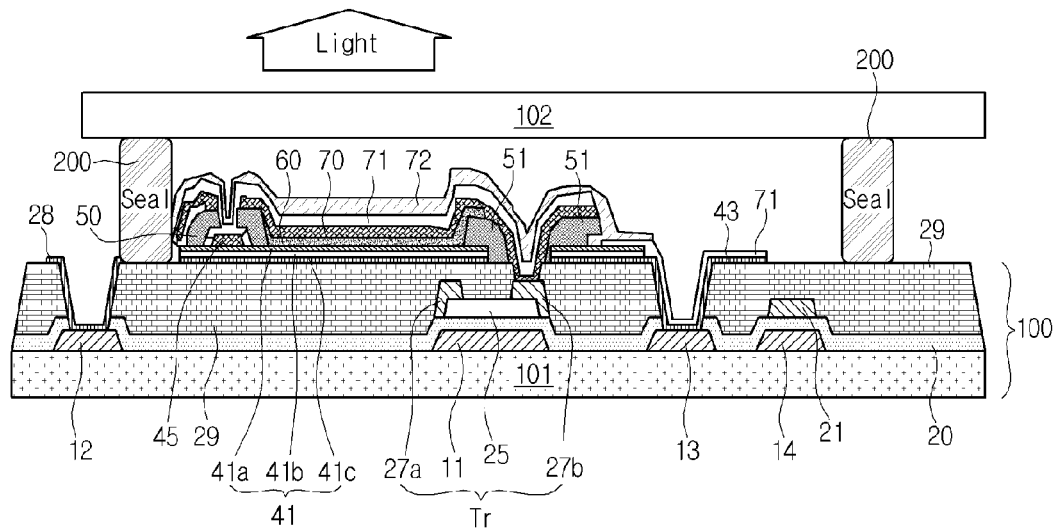
FIG. 1 is a cross-sectional view of an organic electroluminescent device according to an embodiment.

FIG. 1 is a cross-sectional view of an organic electroluminescent device according to an embodiment.

As shown in FIG. 1, a gate electrode 11, power line 12, and first dummy pattern 14 are formed on a transparent dielectric substrate 101. A pad 12 is formed on an edge of the dielectric substrate 101. The gate electrode 11, power line 12, first dummy pattern 14, and pad 12 may be formed of an AlNd single layer or dual metal layer including an AlNd/Mo.

An active layer 25 and source and drain electrodes 27a and 27b are formed on the gate electrode 11 with a gate dielectric 20 interposed therebetween. The gate electrode 11, active layer 25, and source and drain electrodes 27a and 27b constitute a TFT Tr. In addition, a second dummy pattern 21 is formed on the first dummy pattern 14 in the course of forming the source and drain electrodes 27a and 27b. The metal for the source and drain electrodes 27a and 27b may be Mo, Mo alloy, Cu or Cu alloy.

A planarization layer 29 is formed on the dielectric substrate 101 on which the TFT Tr is formed and a first electrode 41 formed with first, second, and third electrode layers 41a, 41b, and 41c is formed on the planarization layer 29. A contact pad 28 and power contact pad 43 are formed at a region of the power line 13 in the course of forming the third electrode layer 41c.

In addition, the first electrode layer 41a and third electrode layer 41c are formed of a transparent material such as ITO, IZO, or ITZO. The second electrode layer 41b is formed of Mo or Al. The second electrode layer 41b functions as a reflective plate and the first electrode 41 may be an anode.

As described above, when the first electrode 14 is formed on the planarization layer 19, a buffer layer 50 defining a sub-pixel region is formed by forming a dielectric film on the dielectric substrate 101 and patterning the dielectric film. The reference number 51 in FIG. 1 is a buffer pattern indicating a part of the buffer layer 50 defining the sub-pixel region. The buffer pattern 51 is formed together with the buffer layer 50.

When the buffer layer 50 is formed, an organic luminescent layer 60 and a second electrode 70 are sequentially formed. At this point, the second electrode 70 is partly removed from the region of the buffer 50. An electrode pattern 45 is formed on the first electrode 41 at a central region of the buffer layer 50. A part of the second electrode 70 that is divided in a sub-pixel unit is electrically connected to the drain electrode 27b through a contact hole formed at the region of the drain electrode 27b. The first electrode 41, electroluminescent layer 60, and second electrode 70 constitute a light emitting diode. The second electrode 70 may be a cathode.

First and second passivation layers 72 and 72 are formed on the second electrode 70 to completely isolate the light emitting diode including the organic electroluminescent layer 60 from an external side. The first and second passivation layers 71 and 72 are formed of an inorganic or organic material.

Additionally, since the central region of the buffer layer 50 is separated so that the first electrode 41 can be exposed. Accordingly, the first and second passivation layers 71 and 72 are filled in the central region of the buffer layer 50 for separating the second electrode 70. Therefore, at the separation region (buffer layer region) of the sub-pixel, the organic electroluminescent layer 60 and the second electrode 70 are isolated from the external side. Thus, from this above, a lower substrate 100 is provided.

Further, a seal line 200 is formed along an edge of a lower substrate 100. An upper substrate 102 that is formed of a transparent dielectric material is attached to the lower substrate 100.

In the embodiment, a dual-passivation layer is formed to extend from a region where the light emitting diode is formed to a boundary region of the sub-pixel, thereby preventing the reliability deterioration of the light emitting diode due to the infiltration of the moisture or outgas.

FIGS. 2A to 2D are cross-sectional views illustrating a method of fabricating an electroluminescent device according to an embodiment.

Since parts illustrated in FIGS. 2a to 2d are same as those of the lower substrate 100 of FIG. 1, like reference numbers will be used to refer to the like parts.

Figure 2A:
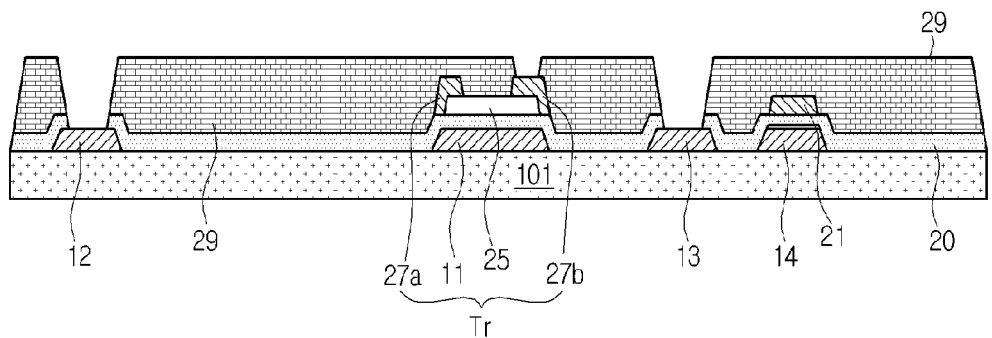
FIGS. 2A to 2D are cross-sectional views illustrating a method of fabricating an electroluminescent device according to an embodiment.

As shown in FIG. 2A, when the gate electrode 11, power line 13, first dummy pattern 14 are formed on the dielectric substrate 101 and the pad 12 is formed on the edge of the dielectric substrate 101, the active layer 25 and the source and drain electrodes 27a and 27b are formed on the gate electrode 11 to form the TFT Tr.

When the TFT is formed on the dielectric substrate 101 as described above, the planarization layer 29 is formed and a contact hole forming process is performed to expose the drain electrode 27b, power line 13, and pad 12 such that a contact hole is formed in the planarization layer 29.

Figure 2B:
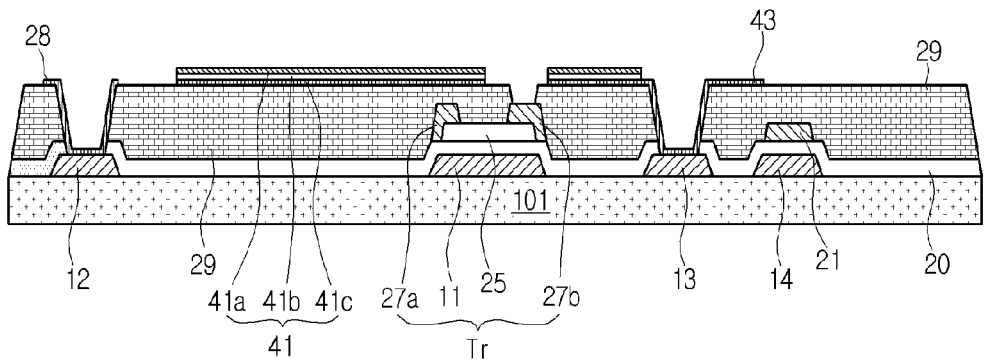

As shown in FIG. 2B, after the contact hole is formed through the planarization layer 29, an ITO-based/Mo metal layer or Al-based/ITO(IZO or ITZO)-based metal layer are sequentially formed and a mask process is performed to form the first electrode 41 formed with the first, second, and third electrode layers 41a, 41b, and 41c are formed at the pixel region. Next, the contact pad 28 and the power contact pad 43 are formed at the region of the pad 12 and power line 13 when the third electrode layer 41c is formed.

Figure 2C:
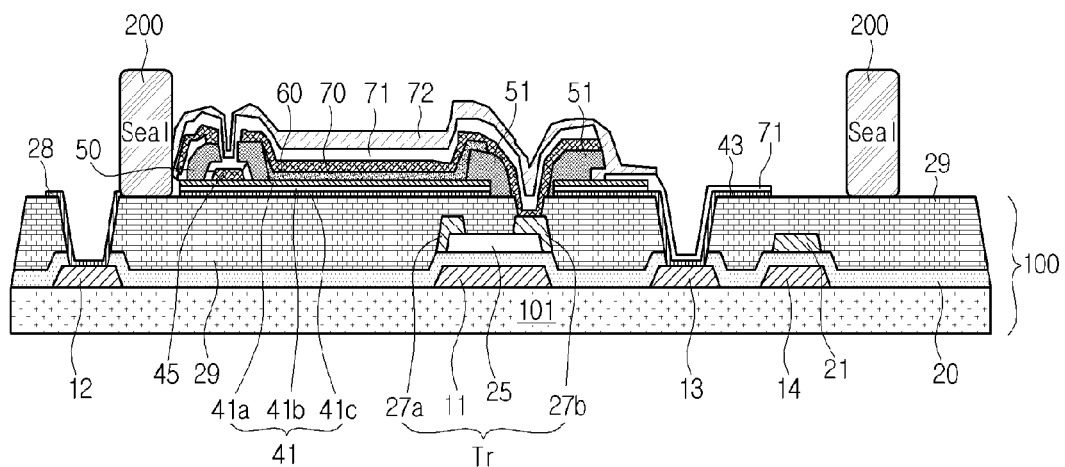

Next, as shown in FIG. 2C, after the dielectric film is formed on the dielectric substrate 101 and the buffer layer 50 is formed by patterning the dielectric film. The central region of the buffer layer 50 is provided in the form of an undercut so that the first electrode 41 is exposed. The reference number 51 in FIG. 2C is a buffer pattern indicating a part of the buffer layer 50 defining the sub-pixel region. The buffer pattern 51 is formed together with the buffer layer 50.

When the buffer layer 50 is formed as described above, the organic electroluminescent layer 60 is formed at the sub-pixel region and subsequently a metal layer is formed on the dielectric substrate 101 to form the second electrode 70 on the organic electroluminescent layer 60. The metal layer is separated from the undercut region to form the second electrode 70 in the sub-pixel unit. At this point, the electrode pattern 45 is formed on the first electrode 41 at the undercut region of the buffer layer 50. The electrode pattern 45 serves to lower the resistance of the first electrode 41.

Further, a part of the second electrode 70 is electrically connected to the drain electrode through the contact hole formed through the planarization layer 29.

As described above, a first passivation layer 71 is formed on an entire region of the dielectric substrate 101 after the second electrode 70 is formed. As the passivation layer 71 is formed on the second electrode 70, the second electrode 70 and organic electroluminescent layer 60 that are partly exposed at the buffer layer 50 by being connected to the undercut region of the buffer layer 50 region without being disconnected are completely isolated from the external side.

In addition, a passivation pattern 71 is formed at the region of the power contact pad 43 to prevent the contact pad 43 from being exposed to external air.

When the first passivation layer 71 is formed on the dielectric substrate 101, a second passivation layer 72 is formed on the dielectric substrate 101. The second passivation layer 72 is also filled in the region of the buffer layer 50 to completely shield the region of the light emitting diode from the external side.

In the embodiment, the first and second passivation layers 71 and 72 are formed of an inorganic or organic material. Alternatively, the first passivation layer 71 may be formed of the inorganic material and the second passivation layer 72 may be formed of the organic material.

Further, a height of the buffer layer 50 is higher than a thickness of the second electrode 70 and less than a sum of the thicknesses of the second electrode 70 and first and second passivation layers 71 and 72. For example, when the thickness of the second electrode 70 is 500 Å and the sum of the thicknesses of the first and second passivation layers 71 and 72 is 1000 Å, the height of the buffer layer 50 is greater than 500 Å but less than 1500 Å.

The height of the buffer layer 50 may be 200 Å-2 μm.

The reason for limiting the height of the buffer layer 50 to the above range is that the buffer layer 50 must be higher than the thickness of the second electrode 70 to surely separate the second electrode 70 in a sub-pixel unit. By the process above, a lower substrate 100 is provided.

After the second passivation layer 72 is formed on the dielectric substrate, the seal line 200 is formed on the dielectric substrate 101 by dispensing ultraviolet-setting sealant or thermosetting sealant on the dielectric substrate 101.

Figure 2D:
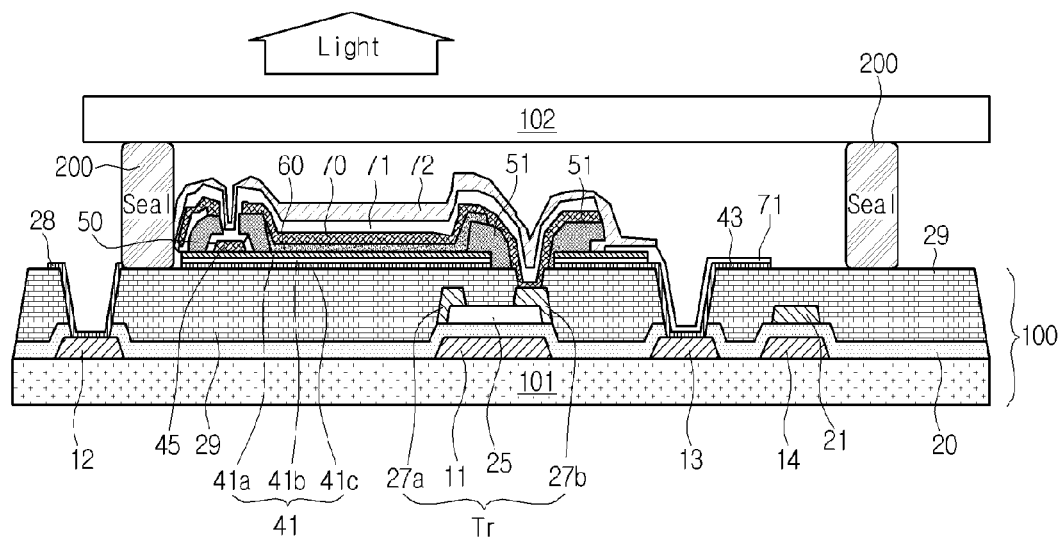

Next, as shown in FIG. 2D, an upper substrate 102 is attached to the lower substrate 100 to complete the organic electroluminescent device.

According to the embodiments, by forming the first and second passivation layers on the substrate on which the light emitting diode is formed, the light emitting diode region and the sub-pixel boundary region can be completely isolated from the external side, thereby enhancing the reliability of the device.

As described above, infiltration of moisture or outgas into an organic electroluminescent layer is prevented by forming the plurality of passivation layers on the substrate on which the electroluminescent layer is formed.

In addition, since the TFT and the light emitting diode are formed on a signal substrate, the degree of freedom for forming the seal line used for attaching the substrates can be improved.

It will be apparent to those skilled in the art that various modification and variations can be made in the present invention. Thus, it is intended that the present invention covers the modifications and variations of this invention provided they come within the scope of the appended claims and their equivalents.

What is claimed is:

1. An organic electroluminescent device comprising:
   a first substrate;
   a second substrate;
   a thin film transistor on the first substrate;
   a insulation layer formed on the thin film transistor, and the insulation layer including a contact hole to expose a portion of a drain electrode of the thin film transistor;
   a light emitting diode comprising first and second electrodes and an organic luminescent layer on the first substrate;
   a buffer layer for separating the organic electroluminescent layer in a sub-pixel region; and
   first and second passivation layers on the first substrate on which the light emitting diode is formed,
   wherein the buffer layer is located on the first electrode and has a central region formed in an undercut shape for exposing the first electrode,
   wherein the buffer layer is located on the first electrode and has a central region formed in an undercut shape for exposing the first electrode;
   wherein the second electrode of the light emitting diode is electrically connected to the drain electrode of the thin film transistor via the contact hole,
   wherein the first and second passivation layers are contacted with each other in the buffer layer and the sub-pixel region,
   wherein the first electrode is formed with a first, second and third electrode layers and a contact pad and a power pad are formed at a region of the power line in the course of forming the third electrode layer, and
   wherein the first passivation layer further fully covers and is in direct contact with the power contact pad to prevent the power contact pad from being exposed to external air.

2. The organic electroluminescent device according to claim 1, wherein the first and second passivation layers are filled in an exposed region of the buffer layer for the first electrode.

3. The organic electroluminescent device according to claim 1, further comprising a planarization layer between the thin film transistor and the light emitting diode.

4. The organic electroluminescent device according to claim 1, wherein the first and the third electrode layers of the first electrode are formed of ITO layers and the second electrode layer of the first electrode is a Mo layer.

5. The organic electroluminescent device according to claim 1, wherein the height of the buffer layer is higher than a thickness of the second electrode and is lower than a sum of thicknesses of the second electrode and the first and second passivation layers.

6. The organic electroluminescent device according to claim 1, wherein the height of the buffer layer is 200 Å-2 μm.

7. A method of fabricating an organic electroluminescent device, the method comprising:
   providing a substrate;
   forming a thin film transistor on the substrate;
   forming a planarization layer on the substrate on which the thin film transistor is formed;
   forming a contact hole through the planarization layer;
   forming a first electrode on the planarization layer;
   forming a buffer layer on the first electrode for separating the sub-pixel region;
   forming a light emitting diode by forming an organic electroluminescent layer and a second electrode on the first electrode on which the buffer layer is formed; and
   sequentially forming first and second passivation layers on the substrate on which the light emitting diode is formed,
   wherein the buffer layer is located on the first electrode and has a central region formed in an undercut shape for exposing the first electrode,
   wherein the first passivation layer is formed on the buffer layer and the second electrode of the sub-pixel region, and
   wherein the second passivation layer is directly contacted with the first passivation layer in the buffer layer and the sub-pixel region, wherein the first electrode is formed with a first, second and third electrode layers and a contact pad and a power pad are formed at a region of the power line in the course of forming the third electrode layer, and wherein the first passivation layer further fully covers and is in direct contact with the power contact pad to prevent the power contact pad from being exposed to external air.

8. The method according to claim 7, wherein the first and the third electrode layers of the first electrode are formed of ITO layers and the second electrode layer of the first electrode is a Mo layer.

9. The method according to claim 7, wherein the height of the buffer layer is higher than a thickness of the second electrode and is lower than a sum of thicknesses of the second electrode and the first and second passivation layers.

10. The method according to claim 7, wherein the height of the buffer layer is 200 Å-2 µm.

* * * * *